United States Patent [19]
Krakauer et al.

[11] Patent Number: 4,818,969
[45] Date of Patent: Apr. 4, 1989

[54] METHOD OF FIXED-LENGTH BINARY ENCODING AND DECODING AND APPARATUS FOR SAME

[75] Inventors: Lawrence J. Krakauer, Wayland; Larry Baxter, Carlisle, both of Mass.

[73] Assignee: Kronos, Inc., Waltham, Mass.

[21] Appl. No.: 188,176

[22] Filed: Apr. 26, 1988

Related U.S. Application Data

[63] Continuation of Ser. No. 829,288, Feb. 13, 1986, abandoned, which is a continuation-in-part of Ser. No. 638,996, Aug. 9, 1984, abandoned.

[51] Int. Cl.$^4$ .............................................. H03M 7/20
[52] U.S. Cl. .................................................... 341/80
[58] Field of Search ................................ 340/347 DD

[56] References Cited

U.S. PATENT DOCUMENTS

| | | | |
|---|---|---|---|
| 4,161,725 | 7/1979 | Stakhov | 340/347 AD |
| 4,187,500 | 2/1980 | Stakhov et al. | 340/347 DD |
| 4,276,608 | 6/1981 | Stakhov et al. | 364/768 |
| 4,290,050 | 9/1981 | Stakhov | 340/347 DA |
| 4,290,051 | 9/1981 | Stakhov et al. | 340/347 DD |

*Primary Examiner*—L. T. Hix
*Assistant Examiner*—David M. Gray
*Attorney, Agent, or Firm*—Rines and Rines, Shapiro and Shapiro

[57] ABSTRACT

A novel method of adapting Fibonacci number weighting to raw binary code data of variable length to use the code as a fixed length code by using only those code sequences with a fixed number of cells rather than a fixed number of bits, converting the code to a continuous numerical sequence useful particularly for linear media and data transmission. Encoder and decoder systems useful to enable storing or recording and reading or utilization of the Fibonacci code in bar code, magnetic and other media.

14 Claims, 16 Drawing Sheets

| BIT | CELL | | SENSOR OUTPUT | | DEBOUNCED OUTPUTS: | | | |
|---|---|---|---|---|---|---|---|---|
| | | | | | CARD T MOVING DOWN | | CARD T MOVING UP | |
| | | | CS | QS | C | Q | C | Q |
| | | | 1 | 0 | 1 | 0 | 1 | 1 |
| 7 | 10 | ∅ | 0 | 0 | 0 | 0 | 1 | 0 |
| | 9 | | 0 | 1 | 0 | 1 | 0 | 0 |
| | | | 1 | 1 | 1 | 1 | 0 | 1 |
| 6 | 8 | 1 | 1 | 0 | 1 | 0 | 1 | 1 |
| 7 | | ∅ | 0 | 0 | 0 | 0 | 1 | 0 |
| | 6 | | 0 | 1 | 0 | 1 | 0 | 0 |
| 4 | 5 | ∅ | 1 | 1 | 1 | 1 | 0 | 1 |
| | 4 | | 1 | 0 | 1 | 0 | 1 | 1 |
| 3 | 3 | 1 | 0 | 0 | 0 | 0 | 1 | 0 |
| | | | 0 | 1 | 0 | 1 | 0 | 0 |
| 2 | 2 | 1 | 1 | 1 | 1 | 1 | 0 | 1 |
| | | | 1 | 0 | 1 | 0 | 1 | 1 |
| 1 | 1 | 1 | 0 | 0 | 0 | 0 | 1 | 0 |
| | | | 0 | 1 | 0 | 1 | 0 | 0 |
| | | | 1 | 1 | 1 | 1 | 0 | 1 |
| BOTTOM OF CARD T | | | 1 | 0 | 1 | 0 | 1 | 1 |
| | | | 0 | 0 | 0 | 0 | 1 | 0 |

1 = WHITE
0 = BLACK

EDGE:    C:
WHT ↓ BLK    0
BLK ↑ WHT    1

SENSORS
○ CS
○ QS
○ DS
(FIG. 1B)

| ADDRESS $A_4 A_3 A_2 A_1 A_0$ | "HIGH" PROM 10 $F_{15} F_{14} F_{13} F_{12} F_{11} F_{10} F_9 F_8$ | "LOW" PROM $F_7 F_6 F_5 F_4 F_3 F_2 F_1 F_0$ |
|---|---|---|
| 0 0 0 0 0 | | |
| 0 0 0 0 1 | | |
| 0 0 0 1 0 | | |
| 0 0 0 1 1 | DON'T CARE | DON'T CARE |
| 0 0 1 0 0 | | |
| 0 0 1 0 1 | | |
| 0 0 1 1 0 | | |
| 0 0 1 1 1 | | |
| 0 1 0 0 0 | 0 1 1 0 1 1 1 1 | 1 1 1 1 0 0 0 1 |
| 0 1 0 0 1 | 0 1 0 0 0 1 0 1 | 0 0 1 0 1 1 1 1 |
| 0 1 0 1 0 | 0 0 1 0 1 0 1 0 | 1 1 0 0 0 0 1 0 |
| 0 1 0 1 1 | 0 0 0 1 1 0 1 0 | 0 1 1 0 1 1 0 1 |
| 0 1 1 0 0 | 0 0 0 1 0 0 0 0 | 0 1 0 1 0 1 0 1 |
| 0 1 1 0 1 | 0 0 0 0 1 0 1 0 | 0 0 0 1 1 0 0 0 |
| 0 1 1 1 0 | 0 0 0 0 0 1 1 0 | 0 0 1 1 1 1 0 1 |
| 0 1 1 1 1 | 0 0 0 0 0 0 1 1 | 1 1 0 1 1 0 1 1 |
| 1 0 0 0 0 | 0 0 0 0 0 0 1 0 | 0 1 1 0 0 0 1 0 |
| 1 0 0 0 1 | 0 0 0 0 0 0 0 1 | 0 1 1 1 1 0 0 1 |
| 1 0 0 1 0 | 0 0 0 0 0 0 0 0 | 1 1 1 0 1 0 0 1 |
| 1 0 0 1 1 | 0 0 0 0 0 0 0 0 | 1 0 0 1 0 0 0 0 |
| 1 0 1 0 0 | 0 0 0 0 0 0 0 0 | 0 1 0 1 1 0 0 1 |
| 1 0 1 0 1 | 0 0 0 0 0 0 0 0 | 0 0 1 1 0 1 1 1 |
| 1 0 1 1 0 | 0 0 0 0 0 0 0 0 | 0 0 1 0 0 0 1 0 |
| 1 0 1 1 1 | 0 0 0 0 0 0 0 0 | 0 0 0 1 0 1 0 1 |
| 1 1 0 0 0 | 0 0 0 0 0 0 0 0 | 0 0 0 1 1 0 1 |
| 1 1 0 0 1 | 0 0 0 0 0 0 0 0 | 0 0 0 0 1 0 0 0 |
| 1 1 0 1 0 | 0 0 0 0 0 0 0 0 | 0 0 0 0 0 1 0 1 |
| 1 1 0 1 1 | 0 0 0 0 0 0 0 0 | 0 0 0 0 0 0 1 1 |
| 1 1 1 0 0 | 0 0 0 0 0 0 0 0 | 0 0 0 0 0 0 1 0 |
| 1 1 1 0 1 | 0 0 0 0 0 0 0 0 | 0 0 0 0 0 0 0 1 |
| 1 1 1 1 0 | 0 0 0 0 0 0 0 0 | 0 0 0 0 0 0 0 1 |
| 1 1 1 1 1 | 0 0 0 0 0 0 0 0 | 0 0 0 0 0 0 0 0 |

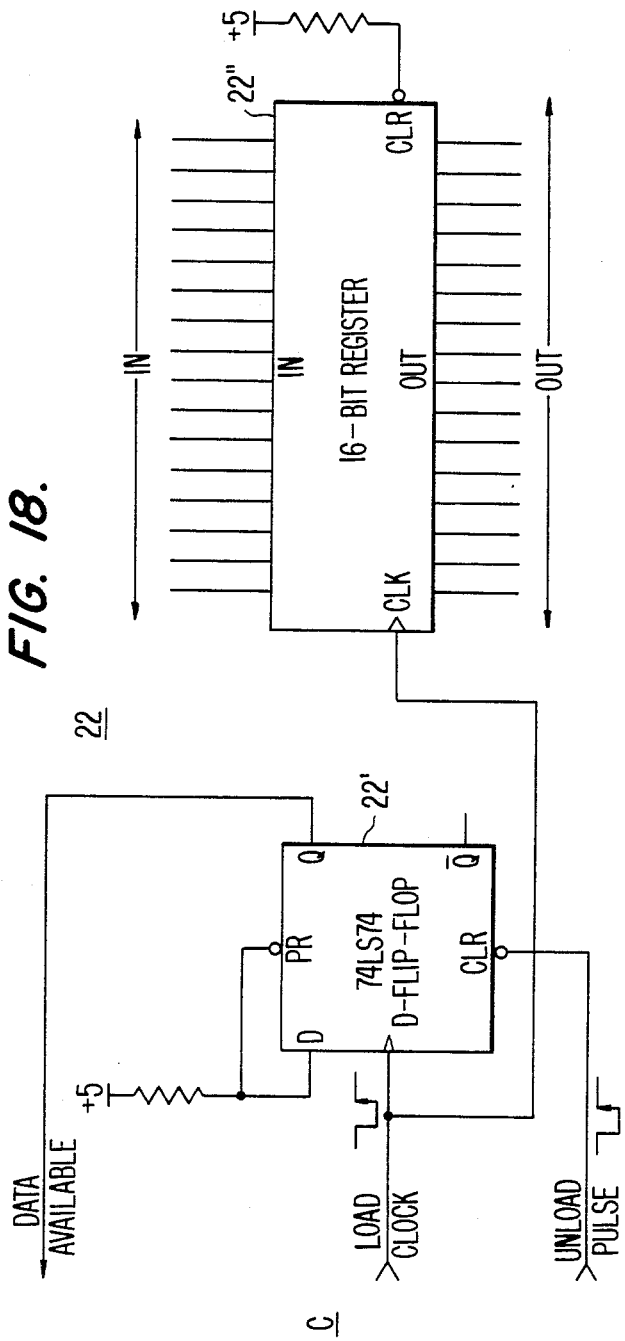
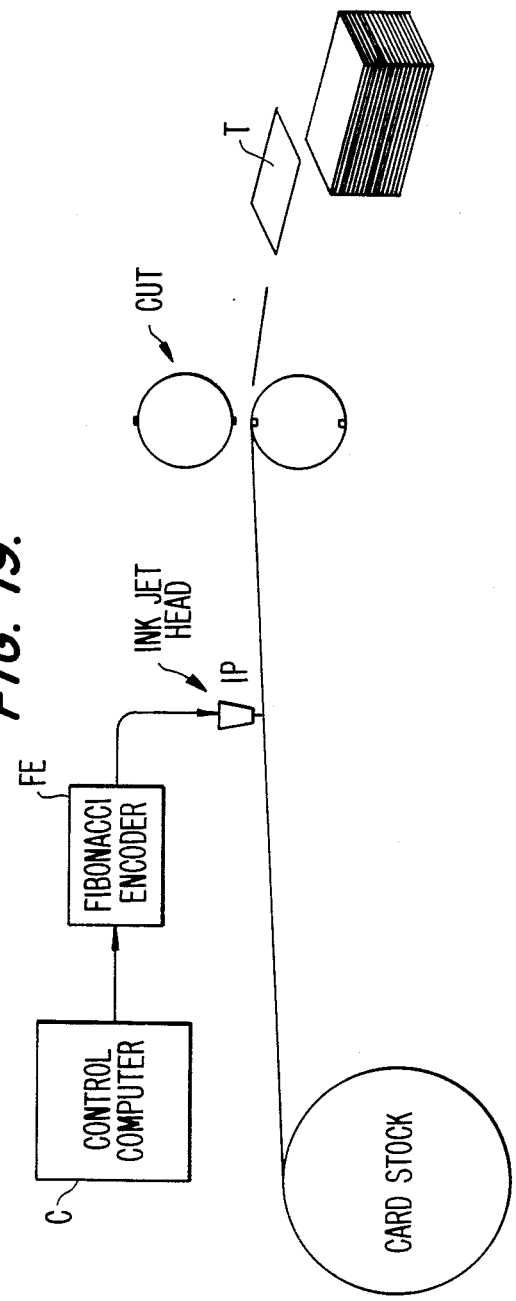
FIG. 18.
FIG. 19.

METHOD OF FIXED-LENGTH BINARY ENCODING AND DECODING AND APPARATUS FOR SAME

This is a continuation application of Ser. No. 829,288, filed Feb. 13, 1986, which is a continuation-in-part of U.S. Ser. No. 638,996, filed Aug. 9, 1984, both of which are now abandoned.

The present invention relates to binary data encoding and reading, being more particularly directed to the conversion of coding by a weighted code to a continuous numerical sequence, particularly useful for single track encoding and reading as on linear media and the like, such as optical readable bars or marks, time cards, magnetic strips, tapes or discs and, more generally, for data transmission purposes as well. This application is a continuation-in-part of U.S. Ser. No. 638,996, filed Aug. 9, 1984 (abandoned).

Recording media of the above and similar types each have a smallest resolvable unit which shall herein be termed a "cell"; the cell size in magnetic media being set by the maximum number of feasible flux changes per inch, or the smallest black or white bar that can be resolved in optical media. Of particular concern to the present invention are media or channels that have no separate clock signal (such as, for example, the striped or barred time cards of our prior U.S. Pat. Nos. 4,270,043 and 4,361,092), so that the bits recorded thereon must somehow be self-clocked.

Among the prior techniques for accomplishing this purpose is so-called Manchester-encoding, also called phase-encoding, using a transition from, say, high logic level to low logic level as a binary "1" and the converse as a "0", with the period between transitions constituting the "cell".

Each bit uses two cells, with a data transition at the end of the second cell, so there is always a "clock" transition at least every other cell. An insignificant transition is added at the end of the first cell if needed to cause the following data transition to go in the proper direction. These and related coding schemes are described, for example, in the following references: *Digital Magnetic Tape Recording for Computer Applications*, L. G. Sebestyen, Chapman and Hall Ltd., London (1973), Distributed in U.S. by Halsted Press, a division of John Wiley and Sons, New York (Library of Congress Catalogue Card 73-6263); see section 5.2, "Encoding and Decoding"—general comparison of varius encoding schemes; *ANSI Standard X3. 48-1977*, American National Standards Institute, 1430 Broadway, New York, N.Y. 10018—ANSI standard for Manchester Phase Encoding on Full-Size Cassettes; "Digital Recording in Low-Cost Transports", Clark E. Johnson, Jr., *Digital Design*, June 1977, pp. 38-48—general comparison of various encoding schemes; and "Pulse Codes in Serial Data Communications", Lester S. Sanders, Computer Design, January 1982, p. 203.

Another closely related scheme is "Frequency Modulation", in which there is a "clock" transition at the end of the first cell (between data bits), with a transition at the end of the second cell constituting a "1", and no transition representing a "0". This type of technique is described in the Johnson and Sanders articles, above mentioned, and in "Simple Encoding Schemes Double Capacity of a Flexible Disc", David J. Kalstrom, *Computer Design*, September 1976, pp. 98-102—MFM (Modified Frequency Modulation), MMFM (Modified, Frequency Modulation), and GCR (Groupd Coded Recording).

In the above schemes, the data density os 0.5 bits per cell, and there is always a transition (a "clock" transition used to resynchronize the reader or receiver) at least every two cells.

Another approach called "group encoding", or "run-length coding", involves groups of four bits encoded into 5-bit "run-length" codes, such as:

TABLE I

| Data | Code | Data | Code |
|------|-------|------|-------|
| 0000 | 11001 | 1000 | 11010 |
| 0001 | 11011 | 1001 | 01001 |
| 0010 | 10010 | 1010 | 01010 |
| 0011 | 10011 | 1011 | 01011 |
| 0100 | 11101 | 1100 | 11110 |
| 0101 | 10101 | 1101 | 01101 |
| 0110 | 10110 | 1110 | 01110 |
| 0111 | 10111 | 1111 | 01111 |

The run-length codes described in the Kalstrom article, above, and in "Group-Coded Recording Reliably Doubles Diskette Capacity", Pawitter S. Sidhu, *Computer Design*, December, 1976, pp. 84-88—GCR (Group Coded Recording), are carefully chosen so that there are never more than two zeros in a row, even when two codes are concatenated. The codes are then sent using transitions for "1"s and no transitions for "0"s, as in Manchester, but without the intervening "clock" transitions. For example:

| Original Data: | 0 | 0 | 1 | 1 |   | 0 | 1 | 0 | 0 |   |   |
|----------------|---|---|---|---|---|---|---|---|---|---|---|
| Run-Length Code: | 1 | 0 | 0 | 1 | 1 | 1 | 1 | 1 | 1 | 0 | 1 |

It may be noted that up to 3 cells between transitions are possible and that this method uses only 5 cells for 4 bits, for a bit density of 0.8 bits/cell—a 60% improvement over phase or Manchester encoding. There may, however, be up to a 3-cell maximum gap in the previously described methods. In media with poor speed control, this may be critical, and sometimes cannot be tolerated.

Other methods, such as Modified Frequency Modulation (MFM or MMFM) (see the Kalstrom article, supra, and "Second Generation Disc Read/Write Electronics", Robert M. Batey and James D. Becker, *Hewlett Packard Journal*, January, 1984, pp,. 7-12 (describes VLFM, a variant of MFM and MMFM), also increases the bit density, but similarly at the expense of longer periods without a transition to synchronize the receiver or reader.

Another coding scheme called "Variable Cell Width" (VCW) is of particular interest here, since it introduces the idea that data "1's" and data "0's" need not be the same length, (see Johnson article, supra, and "A Compact Tape Transport Subassembly Designed for Reliability and Low Cost", Douglas J. Collins and Brian G. Spreadbury, *Hewlett Packard Journal*, July, 1980, pp. 14-19—VCW encoding (Variable Cell Width), also called a "Delta-distance Code"). In this technique, data "1's" are longer than data "0's", so that although the average data packing density is increased (if the data have an even number of "1's" and "0's" on the average), individual record lengths will vary based on the ratio of "1's" to "0's". This is considered a major shortcoming of this technique.

Underlying the present invention is the discovery that a previously recognized mathematical oddity (the so-called Fibonacci number—*Mathematical Circus*, Martin Gardner, Alfred A. Knopf, Inc., New York (1979) ISNB 0-394-50207-8), Chapter 13, "Fibonacci and Lucas Numbers", pp. 152-168; and *The Fibonacci Quarterly*, Published by "The Fibonacci Association", University of Santa Clara, Santa Clara, Calif. 95053,—may be developed into a weighting code for use with a raw code of variable length, converting the same into a continuous numerical sequence that, while having the noise immunity of Manchester coding and Frequency Modulation, startling provides substantially one-third greater bit density than such prior codes and obviates other limitations thereof. The "Fibonacci numbers" are a series in which each succeeding term is obtained by adding the previous two terms:

| n: | 0 | 1 | 2 | 3 | 4 | 5 | 6 | 7 | 8 | 9 | ... |
|---|---|---|---|---|---|---|---|---|---|---|---|
| Fib(n): | 1 | 1 | 2 | 3 | 5 | 8 | 13 | 21 | 34 | 55 | ... |

Another object of the present invention, accordingly, is to provide a new and improved method of binary code storage or encoding that enables such greater bit density and other improvements.

A further object is to provide novel apparatus particularly suited to the utilization of such improved coding employing Fibonacci numbers.

Still another object is to provide novel encoder and decoder apparatus for use with such Fibonacci codes.

Other and further objects will be explained hereinafter and are more particularly delineated in the appended claims.

In summary, from one of its important aspects, the invention embraces a machine-implemented method wherein numbers are digitally encoded in n fixed-length cells, n being an arbitrary integer, comprising the following machine-implemented encoding steps:

(1) comparing a number to be encoded with a predetermined Fibonacci Number in a sequence of Fibonacci Numbers and generating a first code element consisting of a predetermined first integer number of cells if the number to be encoded is greater than or equal to said predetermined Fibonacci number, but generating a first code element consisting of a predetermined second integer number of cells if the number to be encoded is less than said predetermined Fibonacci Number;

(2) then, if a first code element of said first number of cells has been generated in step (1), subtracting said predetermined Fibonacci Number from the number to be encoded in step (1) and repeating the comparing and generating of step (1) using the difference obtained by the subtracting as the number to be encoded and using the Fibonacci number preceding said pedetermined Fibonacci Number in said sequence, but if a first code element of said second predetermined number of cells has been generated in step (1), performing no subtraction, and repeating the comparing and generating of step (1) using the original number to be encoded and the Fibonacci Number before said preceding Fibonacci Number, thereby to generate a second code element; and iterating steps (1) and (2) until n cells have been utilized in the encoding. Preferred details and best mode embodiment are later set forth.

The invention will now be described in connection with the accompanying drawings, FIGS. 1A and B of which are diagrammatic views of the code technique of the invention applied to optical sensing;

Figure 7:
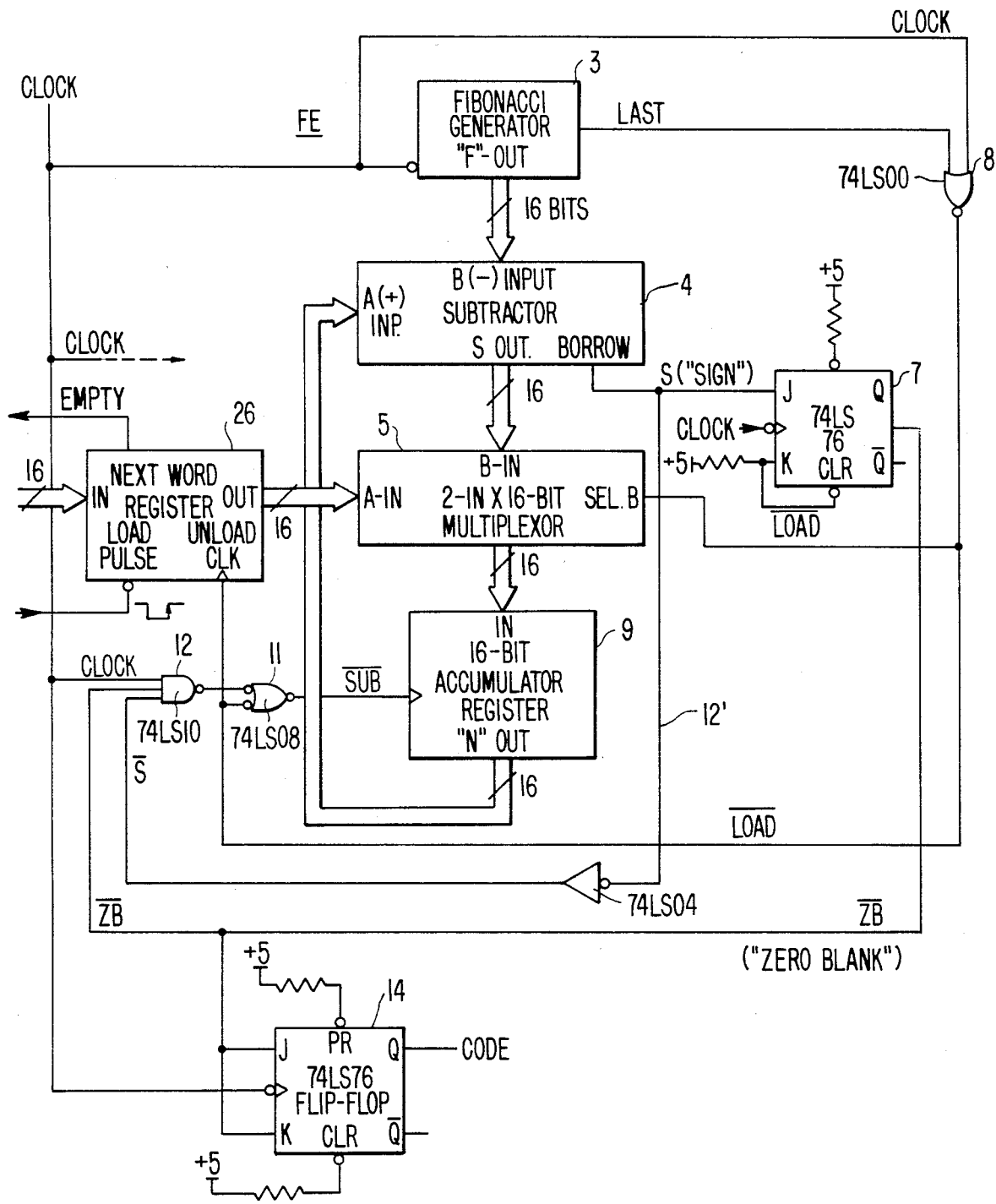
FIG. 7 is a similar diagram of a best mode of encoder employing the generator of FIG. 6.
Figure 8:
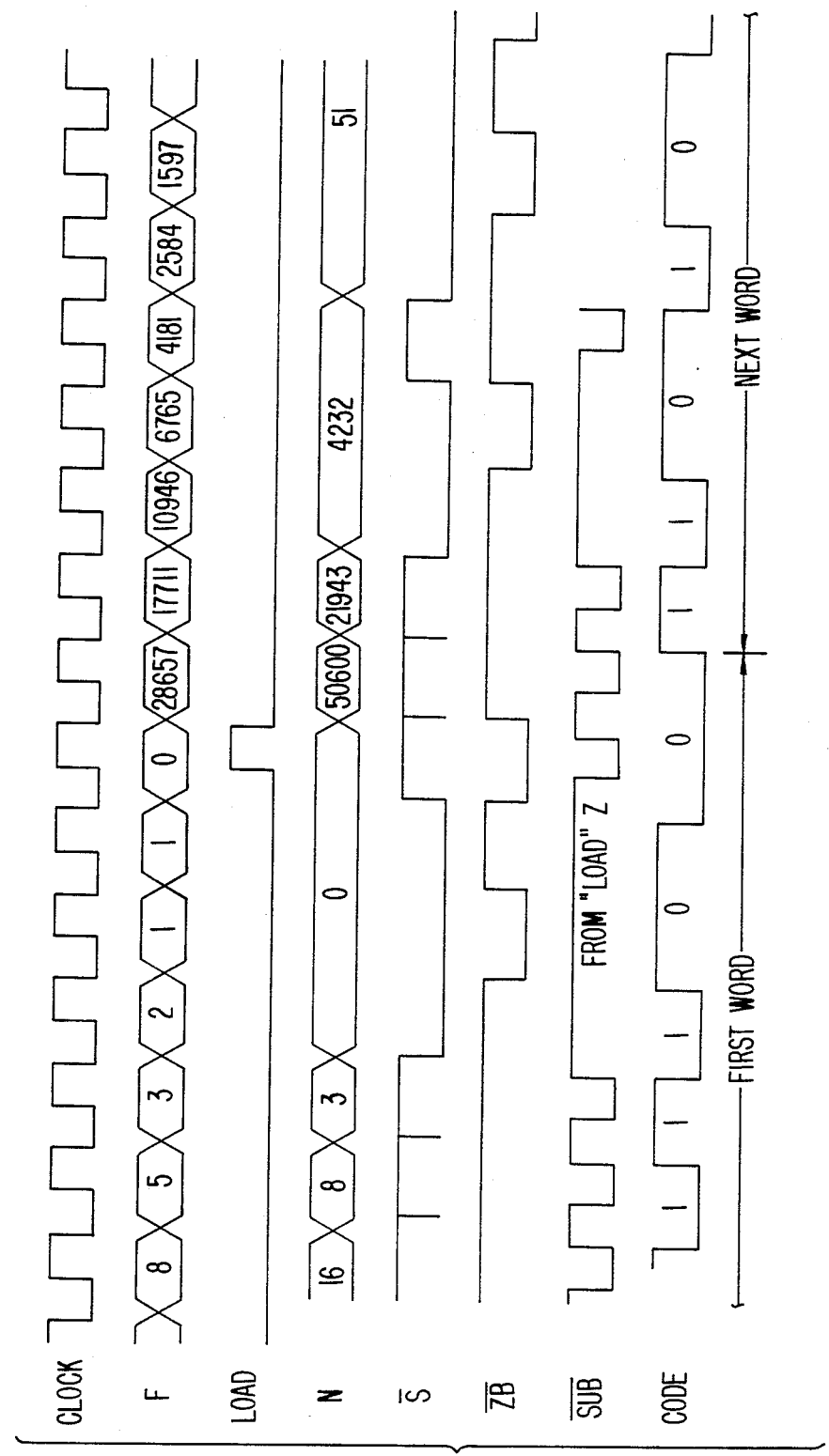
Figure 9:
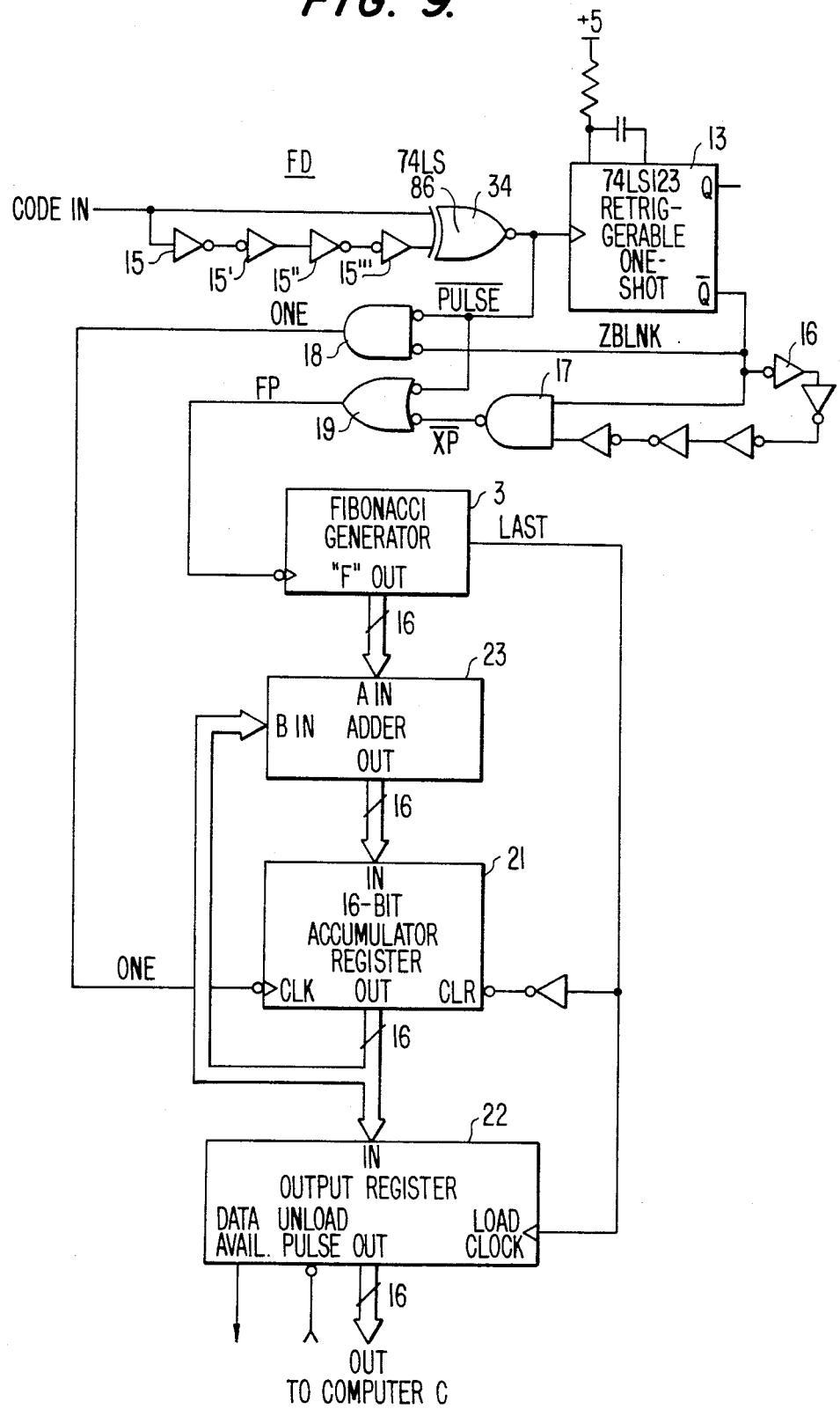
Figure 10:
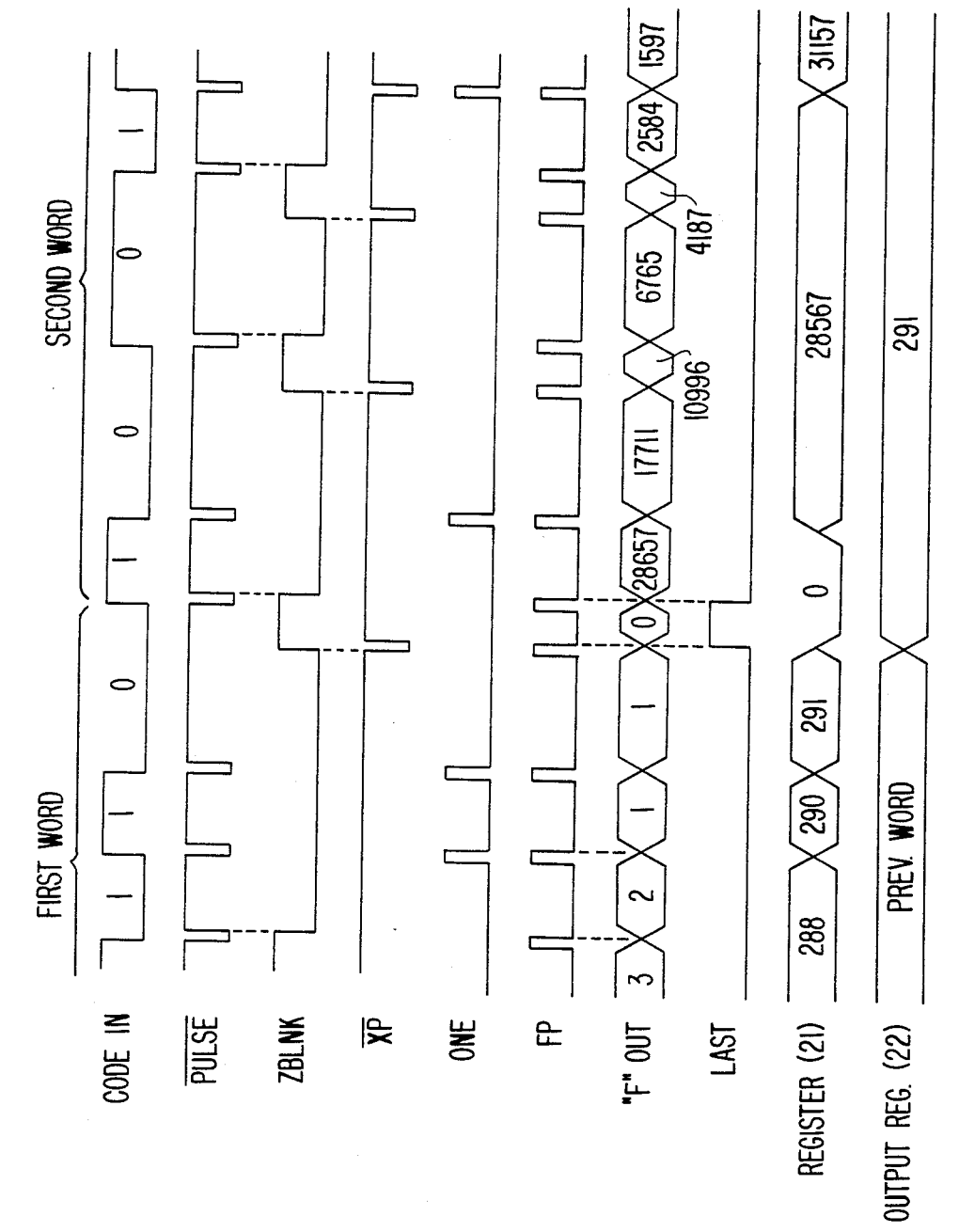

FIG. 8 presents waveforms illustrating the timing of the circuits of FIG. 7;

FIG. 9 is a block circuit diagram similar to FIG. 7 but of a preferred decoder for practicing the method of the invention;

FIG. 10 is a waveform diagram similar to FIG. 8, for the decoder circuit of FIG. 9.

Figure 1A:
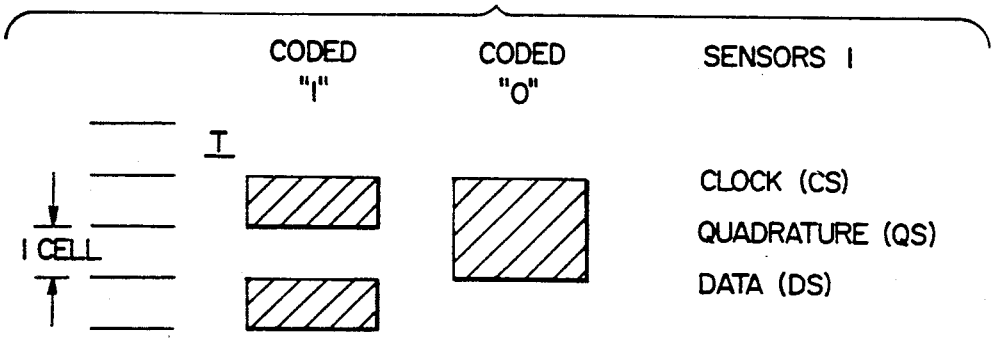
Figure 1B:
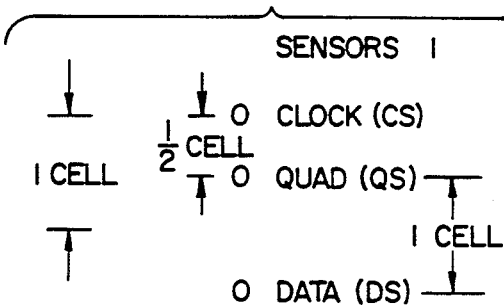
Figures 3, 4:
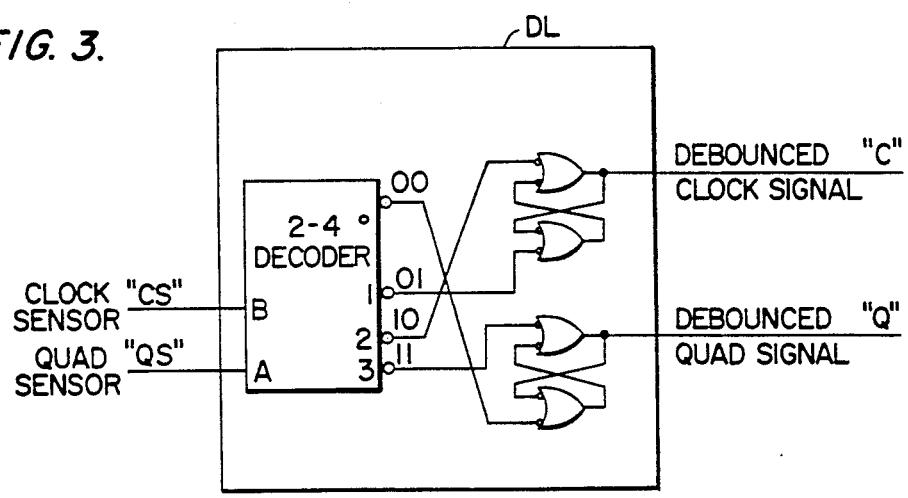
FIG. 3 is a similar diagram of a logic-based debouncing circuit for use in FIG. 2A in accordance with a preferred embodiment.
FIG. 4 is a chart illustrating the application of the variable code in the time card or similar system of FIGS. 1A and 1B.
Figure 5:
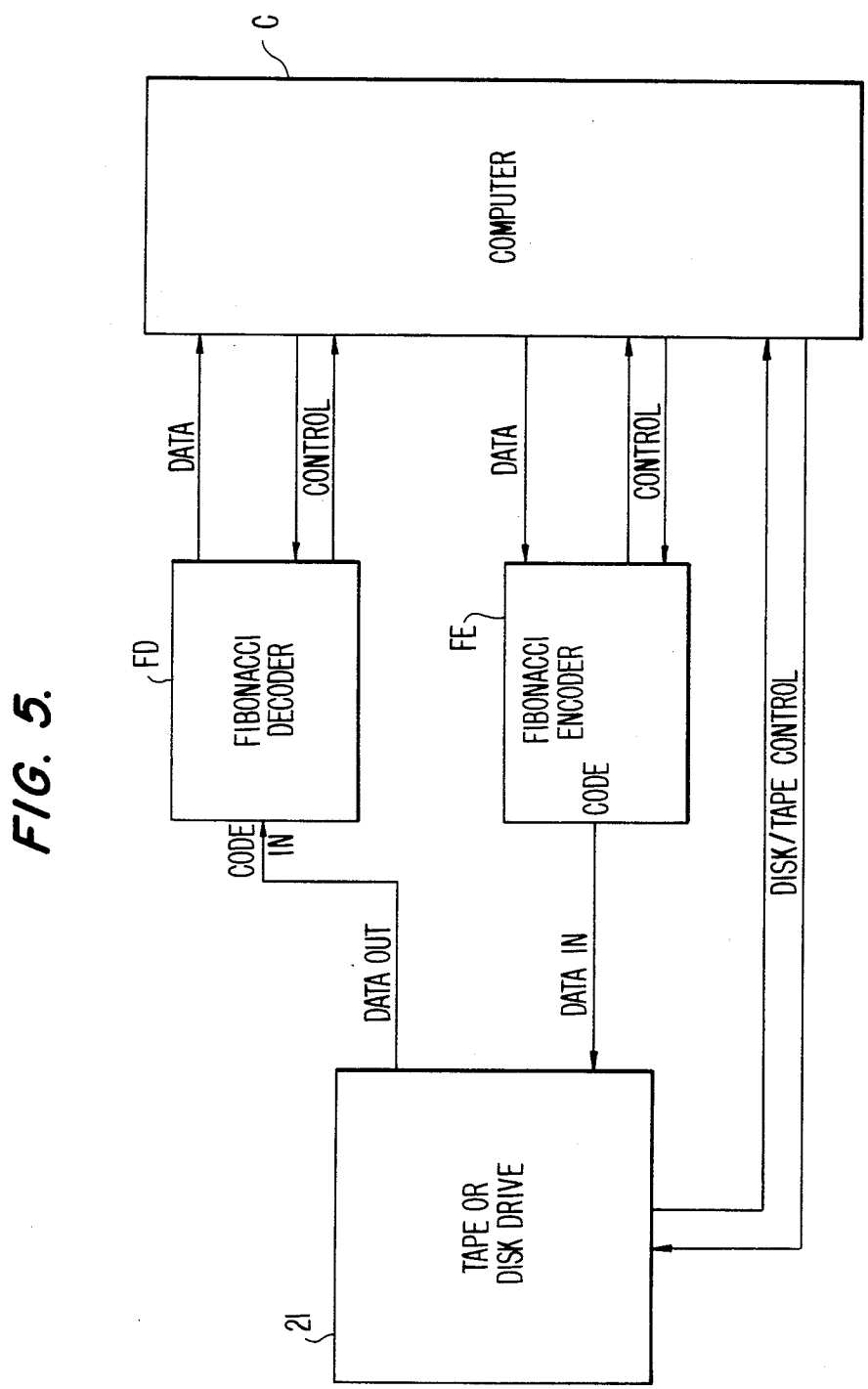
FIG. 5 is a block diagram illustrating the application of the invention to magnetic recording media such as tapes and disks.
Figure 6:
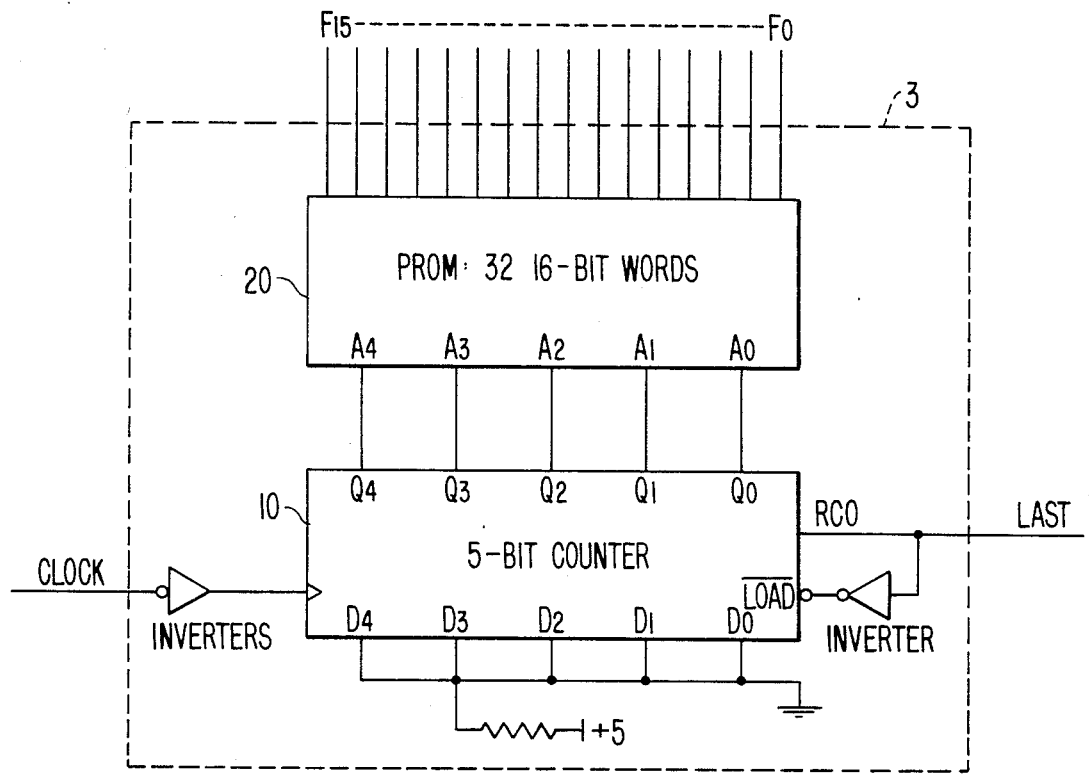
FIG. 6 is a block circuit diagram and code chart for an examplary generator useful in Fibonacci code encoding and decoding for the purposes of the invention with different types of media.
Figure 11:
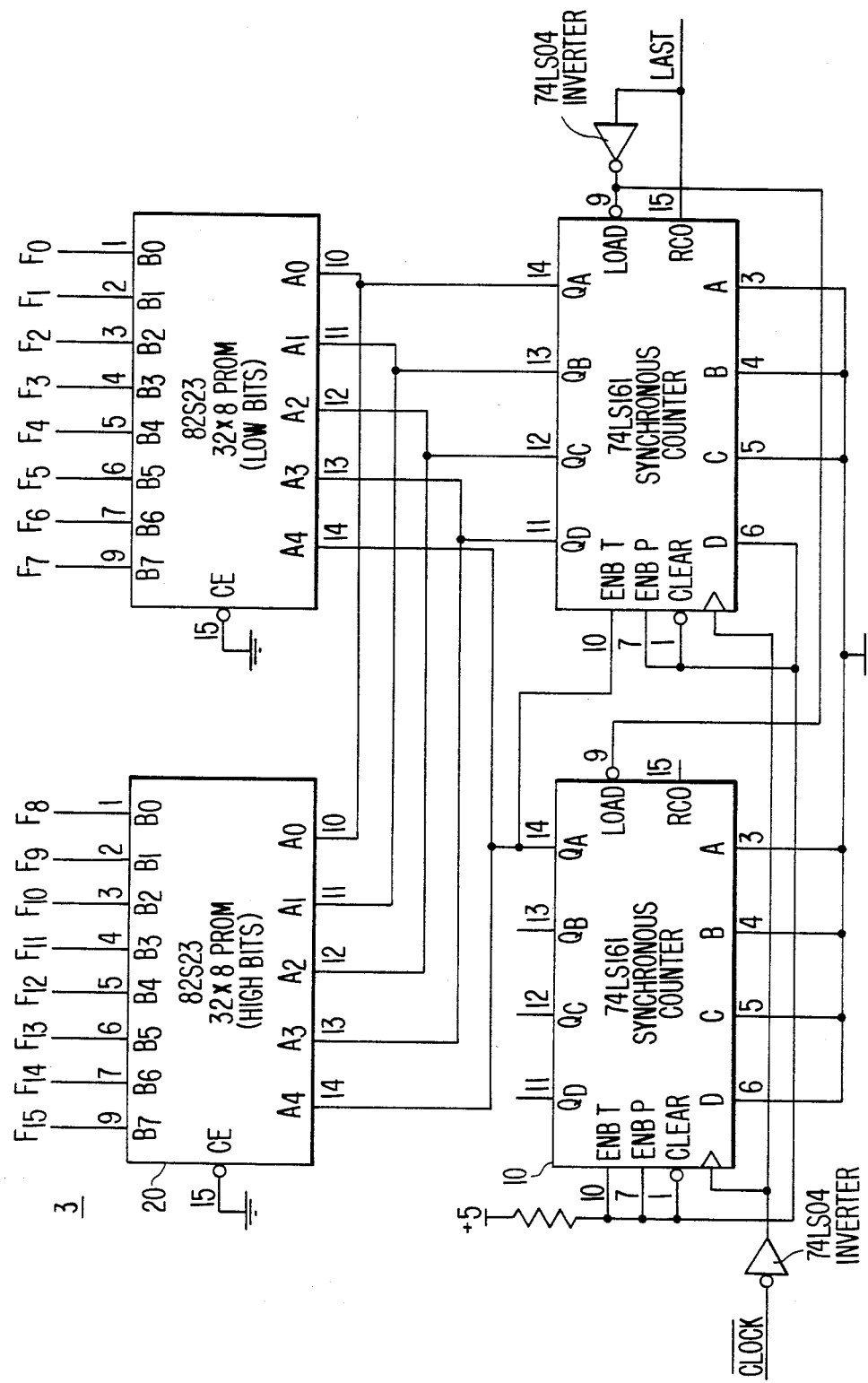
Figure 13:
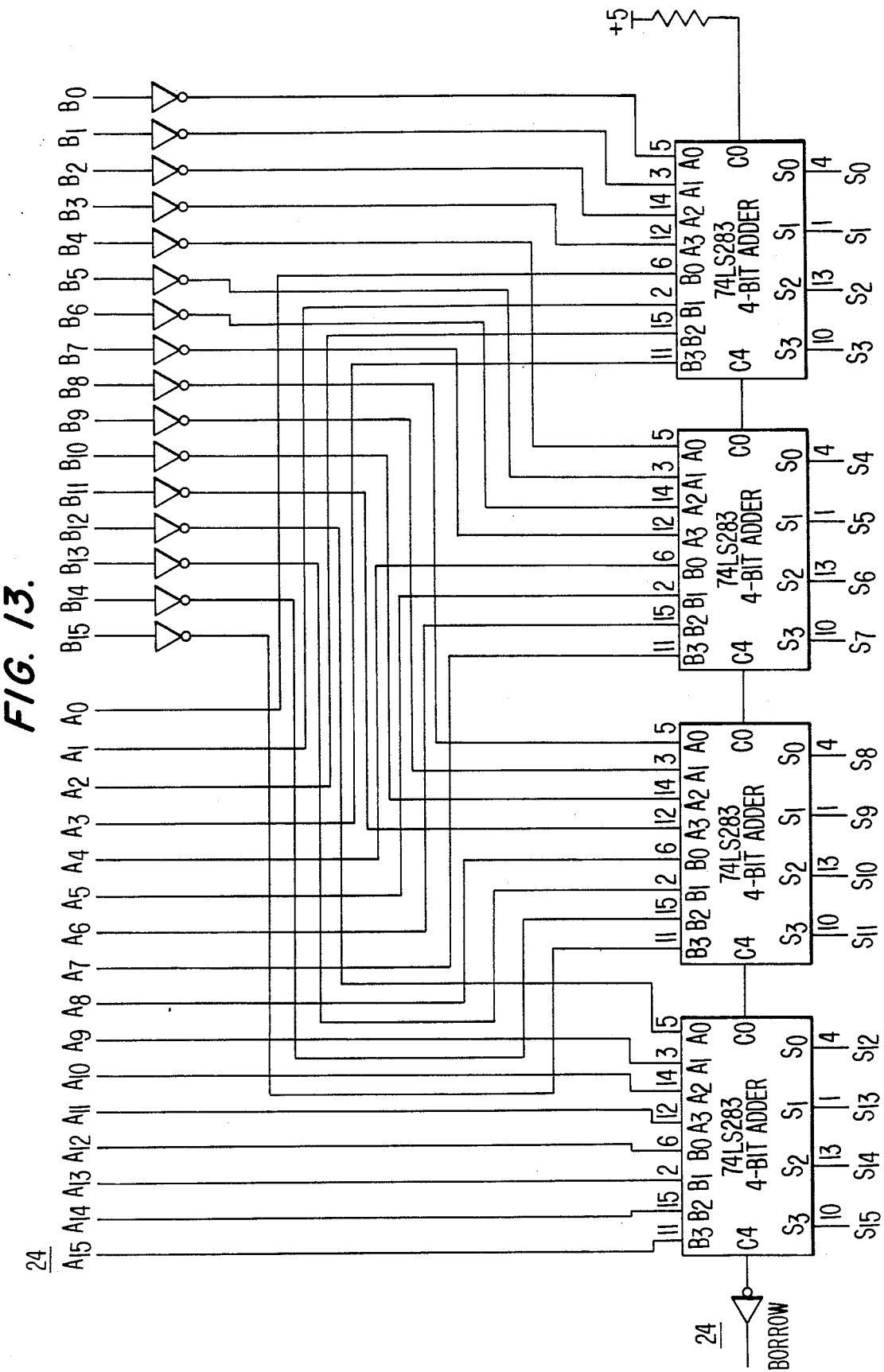
Figure 14:
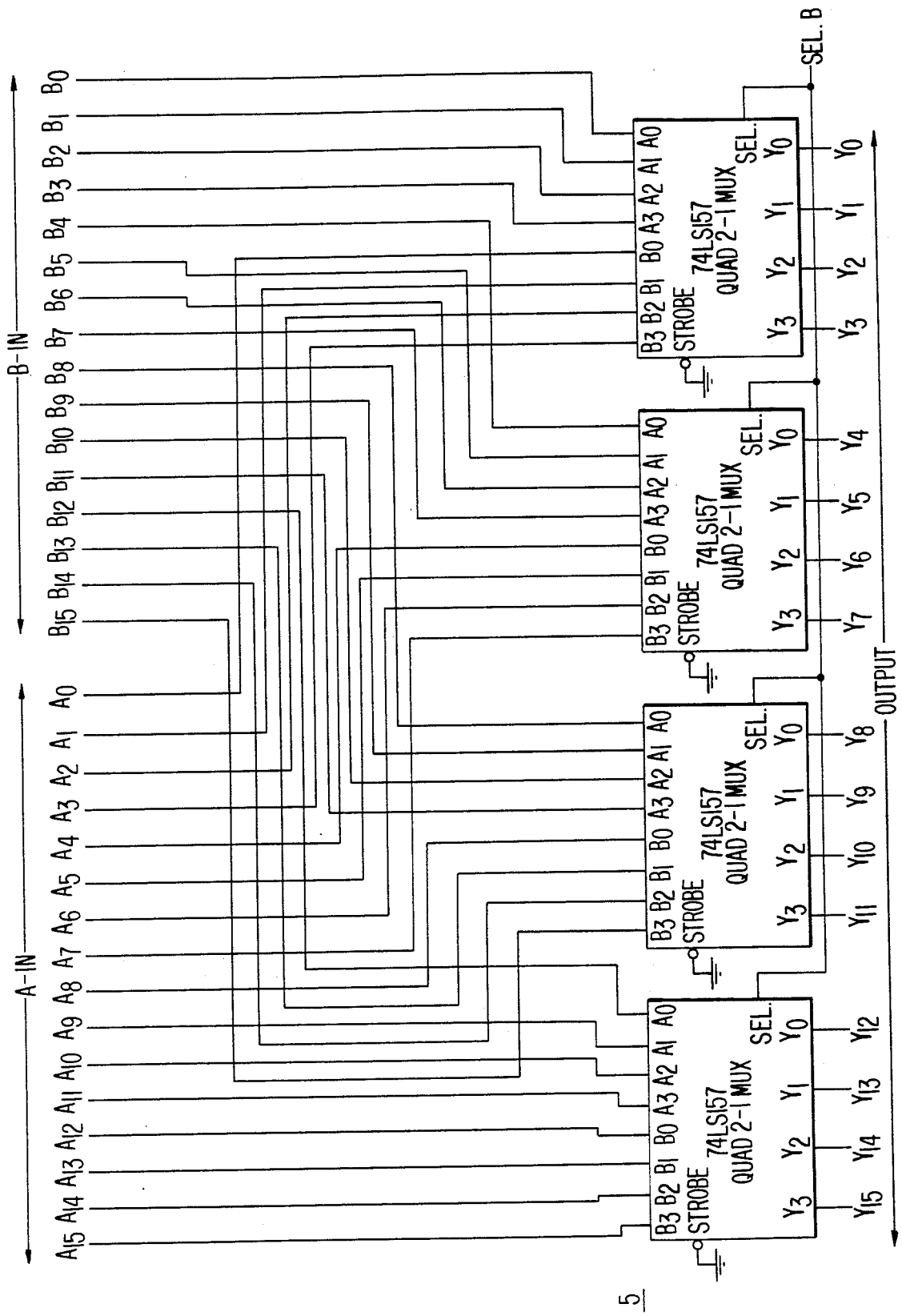
Figure 15:
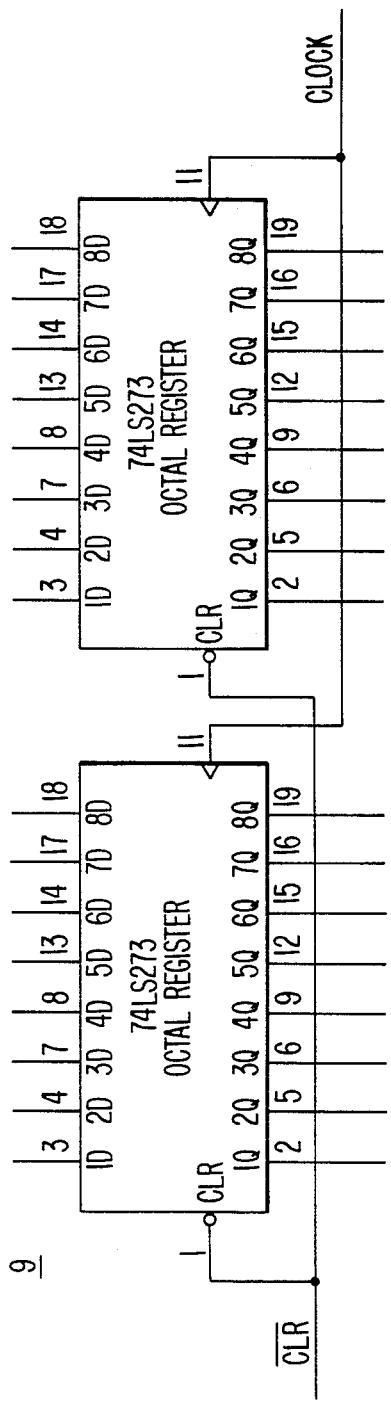
Figure 17:
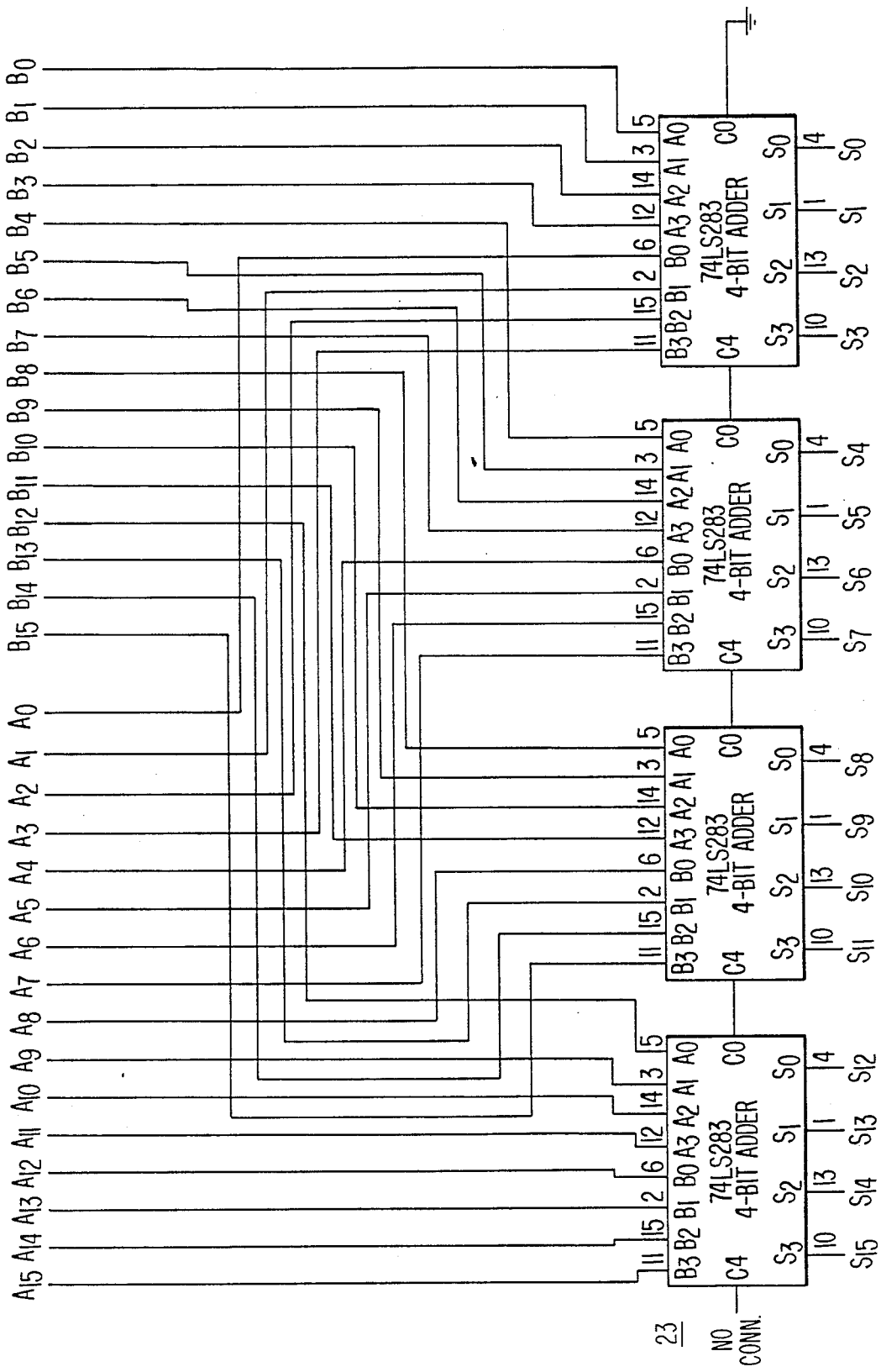
Figure 20:
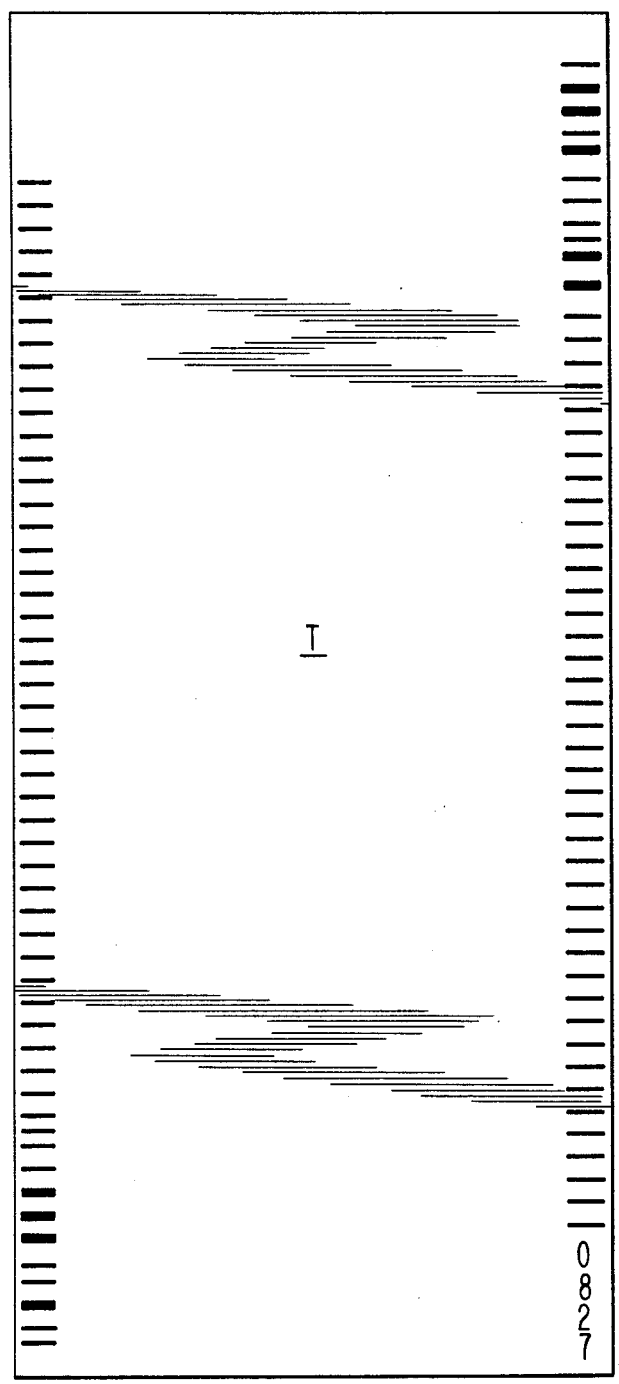

FIG. 11 is a circuit diagram showing more detail of the generator of FIG. 6;

FIG. 12 is a table defining the contents of the PROMs of FIGS. 6 and 11 in best mode application;

FIG. 13 is a detailed circuit of the subtractor component of the encoder of FIG. 7, and FIGS. 14, 15 and 16 are similarly more detailed circuits of the multiplexer, accumulator register and "next word" register of FIG. 7, respectively;

FIGS. 17 and 18 are similar detailed circuits of the respective adder and output register components of the decoder of FIG. 9;

FIG. 19 is a view similar to FIG. 5 illustrating the application of the invention to bar code printing as for the time cards of FIGS. 1A, 1B and 4; and FIG. 20 is a reproduction of a time card printed by the system of FIG. 19.

In the novel "Fibonacci Code" of the invention, a "1" is a single cell long, and a "0" is 2 cells long, with transitions separating the bits:

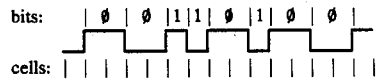

If the method were used to represent the data bits directly, the code would thus be variable length, depending on the data. At first blush, this would seem to make this method of encoding data bits impossible for use on magnetic media and the like where typically the physical length of a block of a fixed number of bits must be the same, regardless of the what the bits are (a block on a data tape, or a "sector" on a disk). However, by employing the encoding method of the invention it is possible to use fixed-length codes.

Consider the number of different codes of a given length; i.e. a given number of cells, not a given number of bits. These codes can be enumerated recursively as follows:

To generate all codes of length n cells, where n is any integer;
Rule a. Take all codes of length n−1, and add a "1" n front (since 1's are 1 cell long, this gives an n-cell code).
Rule b. Take all codes of length n−2, and add a "0" in front (since 0's are 2 cells long, this gives an n-cell code)

TABLE II

| | |
|---|---|
| All codes of length 1 cell: | 1 |
| All codes of length 2 cells: | 11 |
| (note 0s drawn 2 cells wide) | |
| All codes of length 3 cells: | 111 |
| | 1 |
| | 1 |
| All codes of length 4 cells: | 1111 |
| | 11 |
| | 1  1 |
| | 11 |
| All codes of length 5 cells: | 11111 |
| | 111 |
| | 11  1 |
| | 1  11 |
| | 1 |
| | 111 |
| | 1 |
| | 1 |
| All codes of length 6 cells: | 111111 |
| | 1111 |
| | 111  1 |
| | 11  11 |
| | 11 |
| | 1  111 |
| | 1  1   (codes above line |
| | 1    1  from rule (a); |
| | 1111  codes below line |
| | 11    from rule (b), |
| | 1  1  above |
| | 11 |

Several results flow from this, as follows:
1. The number of codes of n cells in length is equal to the number of codes n−1 cells long plus the number of codes n−2 cells long. Further, there is one code of length 1 cell and two codes of length 2 cells. This is exactly the definition of the classic "Fibonacci numbers".
2. Since the numbers of codes "below the line" in Table II is always Fib (n−2), the code can be considered a weighted code (to convert to a binary equivalent); and the weight of the newly-added column on the left at level n is simply Fib (n−2). This operation is detailed below:

TABLE III

Column #(n): 6 5 4 3 2 1
Column weight: 5 3 2 1 1 0 (column weight of right-most column is 0).
= Fib(n-2)

| Codes | Decimal Equivalent |
|---|---|
| 111111 | 12 |
| 1111 | 11 |
| 111  1 | 10 |
| 11  11 | 9 |
| 11 | 8 |
| 1  111 | 7 |
| 1  1 | 6 |
| 1    1 | 5 |
| 1111 | 4 |
| 11 | 3 |
| 1  1 | 2 |
| 11 | 1 |

TABLE III-continued

| | 0 |
|---|---|
| As an example, consider: | |
| | 5 + 3 + 1 = 9 |
| Weights: | 5 3 2 1 1 0 |
| Code: | 1 1    1 1 |

Note: Add the weights of each column containing a "1" (obviously could add in binary just as easily).

Since we have developed a weighted code (essentially a variable radix code), conversion routines to and from the code are will become apparent. An unusual aspect is that zeros must be expanded to "double width" before applying the weights. This conversion algorithm allows the "Fibonacci Code" to be used as a fixed-length code.

For example, blocks of 16 bits can be coded into 24 cells (Fib(24)=75,025; $2^{16}$=65,536); giving a code using only 1.5 cells per bit (⅔ bit/cell=0.666 . . . bits/cell). This code is a 33⅓% improvement in packing density over phase encoding or Manchester encoding. Like those codes, there are at most two cells between transitions, and all transitions are exactly one cell or two cells apart.

Figure 2A:
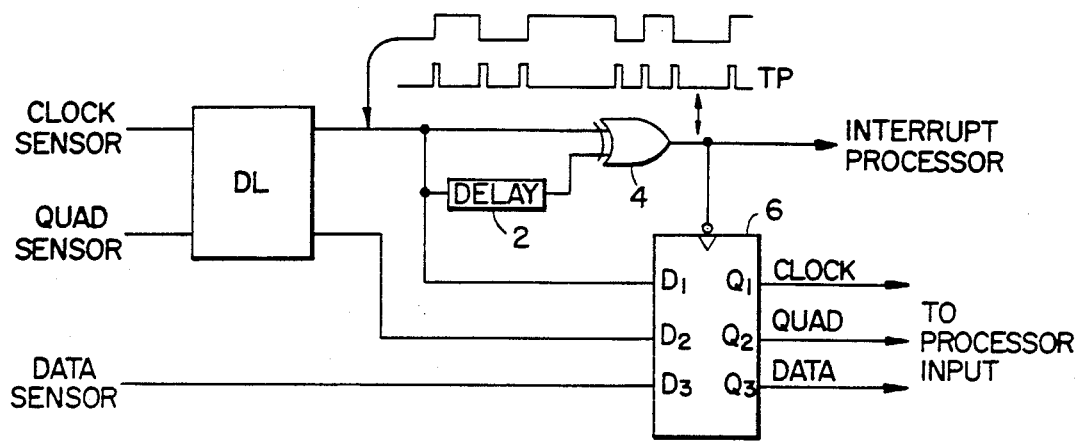
FIGS. 2A and 2B are block circuit diagrams of a suitable reader.
Figure 2B:
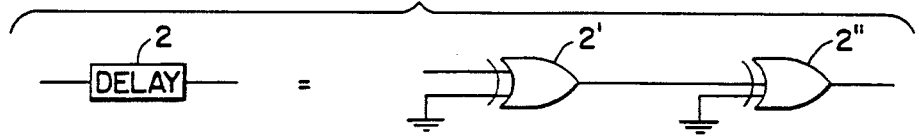

Considering an application of this technique to a moving time card, for example, containing bars recorded or stored thereon in accordance with the code of the invention for optical reading, a preferred scheme for reading this code optically from an irregularly moving time card, using a triple sensor, will now be described. Reference is made to FIG. 1A wherein exemplary bars for a coded "1" and coded "0" are shown on a timecard T in relation to three scanning optical sensors, labelled "clock" sensor CS (which detects the bar edge), "quadrature" sensor QS and "data" sensor DS, the spacings of which relative to a cell are more accurately portrayed in FIG. 1B. To read the code, the circuit of FIGS. 2A and 2B may be employed wherein the debouncing logic circuit DL assumes the form of the circuit of FIG. 3, later described. The stage 6 of FIG. 2A may, for example, be of type 74176. FIG. 2B shows a suitable circuit form for the DELAY device 2 of FIG. 2A, the stages 2' and 2", for example, comprising successive type 7486 stages, such stage being suitable also at 4 for geneating from the DL output, bi-directionally, the transition pulses (waveform TP). The DELAY 2 sets the pulse width of the transition pulses.

The computer or processor is interrupted on each edge of the clock. At interrupt, the direction of motion can be computed from the value read in:

direction=clock⊕QUAD (where ⊕ is Exclusive-OR).

The data value used is data bit=clock⊕data.

That is, if clock sensor output does not equal that of the data sensor, a 2-cell bar is read, which is "0". If, however, the clock and data sensor outputs are equal, a 1-cell bar, is read, which is "1". This operation holds for black or white bars. A lens (not shown) can be used to image the code onto the sensors. The use of the spacially placed multiple sensors of FIG. 2A makes the reading of the code totally independent of speed or even direction of motion of the code past the sensors.

As shown in FIG. 3, the debouncing logic circuit DL is applied to the output of each of the clock and quadrature sensors. With this debouncing, at least ½ cell reversal of the sensors over the code (or vice-versa) must occur before there is another change in the outputs. This prevents jitter around an edge from interrupting at too rapid a rate, without introducing any delay in the response to a true valid edge. The DECODER of DL may, for example, be one-half of a type 74139, with the gates of type 7400, producing the debounced "C" and "Q" signal outputs illustrated.

The variable code application of the invention to the time card or similar useage of FIGS. 1–3 is illustratively summarized in the chart of FIG. 4, showing the sensor 1 of FIG. 1B with its "CS" and "QS" outputs and the corresponding debounced outputs "C" and "Q" for the card T moving down and up, respectively. The debounced "C" output is used to produce interrupts and is defined as the state after interrupt, as diagrammatically shown to the right in FIG. 4.

Preferred or best mode embodiments of suitable Fibonacci encoder and decoder systems for the purposes of the present invention will now be described. The example chosen would, for example, be used for encoding in conventional fashion 16 bit words for recording or storage on a magnetic tape or disk in Fibonacci Code, or to control a conventional computer driven ink printer (as later described) to record the before-mentioned bars on the time card T or other medium of FIGS. 1A and 4. For the former application, as an illustration, it will be assumed that these words are being fed to the interface by a computer for recording on the tape in such code and that words read back from the tape in that Fibonacci Code will be converted back to 16 bit words to be read by a computer. In the top-level block diagram shown in FIG. 5, the encoder FE inputs data (DATA IN) to the tape or disk drive 21, the output data from which (DATA OUT) is applied to the decoder FD, with the computer C applying disk/tape control, as indicated, input data to the encoder FE and control signal communication with FE and decoder FD.

A common circuit that may be used in both the Fibonacci encoder FE and the decoder FD is a Fibonacci generator, shown at 3 in FIG. 6. Although a Fibonacci generator could clearly be made up out of adders and registers, calculating a new Fibonacci number each time it is pulsed by the clock input, it is simpler to just use a counter 10 driving a Programmable Read Only Memory (PROM) 20. In this example, 24 Fibonacci numbers are required, as shown in the table at the bottom of FIG. 6. The numbers encoded into the PROM 20 are shown in decimal, although of course in actuality they would be converted to binary, as is more evident from later-described FIGS. 11 and 12. Since only 24 of the 32 words in the PROM are used, the counter 10 is preloaded with the value of 8. At the trailing edge of each clock pulse, the Fibonacci generator 3 will produce the next Fibonacci number, starting with the higher numbers in the series and working down. It will be seen that the encoder FE and decoder FD produce and read a serial code which has the most significant bit of the Fibonacci Code first.

In the illustrative Fibonacci encoder circuit FE of FIG. 7, the waveforms of the timing diagram of FIG. 8 apply. The "CLOCK" signal (first waveform of FIG. 8) pulses once for the start of each possible short cell on the tape or disk, its frequency being determined by dividing the desired tape recording density, in flux-changes-per-inch (fcpi), by the tape speed, in inches-per-second (ips). At the end of every 24 cells, the Fibonacci generator 3 will produce the signal LAST, FIG. 6, which will cause the word held in the next word register 26 of FIG. 7 to be transferred to the 16-bit accumulator register 9. This word is the next word which is to be writted onto the tape. This is done by producing the LOAD pulse (FIG. 8) out of gate 8, which switches a multiplexer 5 to read the next word register 26, and also pulses accumulator register 9 via gate 11. On the following clock pulse, the Fibonacci generator 3 will begin counting down from the high Fibonacci numbers, producing these outputs at its F-OUT lines, which feed the negative input to the subtractor circuit. In FIG. 8, there is shown the end of one 16-bit word, a load from the next word register 26, and the beginning of the next 16-bit word. At each clock cycle, the subtractor 24 subtracts the current Fibonacci number from the current contents of the accumulator register 9. The subtractor 24 is also acting as a comparator, since it will produce a borrow signal only if the Fibonacci number is greater than the current contents of the accumulator register 9. If the number in the accumulator register 9 is larger than the current Fibonacci number, the clock pulse will pass through gates 12 and 11, and clock the accumulator register 9, causing the current Fibonacci number to be subtracted from the current number in the accumulator register 9. If, however, the current Fibonacci number is too large to be subtracted, the borrow signal S, fed via 12' into gate 12, will prevent accumulator register 9 from being clocked; and that Fibonacci number will not be subtracted on that cycle. The signal S, furthermore, will set flip-flop 7 producing the signal ZB ("ZERO BLANK"), FIGS. 7 and 8. This signal, fed into gate 12, will also prevent the following clock from pulsing accumulator register 9. Thus, two clock pulses will be skipped without performing a subtraction from accumulator register 9, thus producing zeroes in the output code which are two cells long. The ZB signal will always then be removed on the following clock cycle due to the way the JK inputs are connected, regardless of the state of signal S. The final output code, to be written directly on the tape, is produced by flip-flop 14, which is complemented by every single clock pulse, except if the signal ZB is asserted. The final output signal CODE, FIGS. 7 and 8, can be written directly onto a saturating magnetic tape.

By the above operation, the encoder circuit FE produces the Fibonacci Code using the method previous described. It attempts to subtract the highest weight still remaining, and if it can do so it subtracts the weights. But if it cannot do so, it performs the additional step of skipping over the next lower Fibonacci weight, in order to allow for the double width zeroes. This is related to the conventional radix conversion type circuit, in the sense that if the weightes used were the BCD weights (1, 2, 4, 8, 10, 20, 40, 80, . . . ) instead of the Fibonacci numbers, and if the subtraction following the occurrence of a zero were not omitted, a standard binary to BCD ("Binary-Coded-Decimal") conversion would result, as is well known.

Turning, now, to the Fibonacci decoder FD shown in FIG. 9, the waveforms descriptive of its operation are shown in the timing diagram of FIG. 10. Again, the end of one word and the beginning of a second word are shown, although the same words are not used as in the first example. As is typical in a Manchester or other such decoder, the signal is fed into an exclusive-ORgate 34, once directly, and once through a delay circuit 15—15'''. The resulting output PULSE (FIGS. 9 and 10) has a short pulse for every transition in the CODE IN signal. This is fed into a retriggerable one-shot 13 with the duration of about one and a half cell times. The job of this one-shot is to distinguish between signal and double cells in the input stream. In a medium with excellent speed control, the period of the one-shot could be fixed. It is commonplace, however, to use a feedback circuit to adjust the period of the one-shot for the observed speed variations in the tape. A pulse will be taken as being the trailing edge of a "1" bit (two cells long) if the one-shot has not yet timed out when that pulse arrives. This is done by AND-gate 18, FIG. 9, producing a pulse only at the conclusion of "1" bits. This pulse is appropriately called ONE, FIGS. 9 and 10. The signal PULSE is a pulse which occurs at the conclusion of all Fibonacci Code bits, whether "1" or "0". However, zeroes ("0") are actually two cells long, and an additional pulse is needed for each of the double cell zeroes. This is generated by feeding the output ZBLNK (FIGS. 9 and 10) of the one-shot 13 through a circuit which will produce a pulse at the trailing edge of the one-shot output. This circuit, comprising delay chain 16 and the AND-gate 17 of FIG. 9, produces the pulse XP at the trailing edge only of ZBLNK. By combining this with PULSE in gate 19, a signal FP for pulsing the Fibonacci generator 3 is produced which contains a single pulse at the conclusion of each one bit, as shown in FIG. 10, and two pulses during a zero bit, which is two cells long.

The manner in which the decoder FD operates is as follows. As before, the Fibonacci generator 3 generates the Fibonacci words in sequence, starting from the highest and working down. The 16-bit accumulator register 21 is initially cleared, and the Fibonacci number is added in the adder 23 to accumulator register 21 for each "1" bit in the input stream. Whenever there is a "0" bit in the input stream (two cells long), the pulse ONE is omitted, so the register 21 is not pulsed, and in effect the Fibonacci number for that cell is not added in the adder 23. In addition, the Fibonacci generator 3 is pulsed twice by the pulse FP during that bit; once by the pulse XP when the one-shot 13 times out, and a second time by the pulse PULSE at the conclusion of the bit. Thus, not one, but two Fibonacci numbers are skipped over for each zero bit. When the last Fibonacci number has been reached, the signal LAST, FIG. 10, is asserted for one cell, transferring the completed output into the output register 22, and clearing the accumulator register 21. It should be observed that if there is a one in the last cell of the code, this clearing operation will interfere with the addition of the Fibonacci number that would normally be done on that cycle. However, the lowest Fibonacci number for the last cell is a zero anyway, so in fact the number in the accumulator register 21 is already complete by the beginning of the final cell. The final cell in a Fibonacci Code is essentially a place holder, of zero value, except that it allows the number of ones in all of the previous cells to be either odd or even, while still retaining the fixed length characteristics of the code.

Again, this bears similarity to a standard radix conversion circuit; that is, if the numbers out of the Fibonacci generator were chosen differently, and a number were not skipped on the occurrence of a "0" bit, this circuit could be used to do a standard Binary Coded Decimal (BCD) to binary conversion in conventional fashion. By choosing the Fibonacci weights, and by accounting for the double width zero bits, a Fibonacci decoder FD is generated, instead.

The starting up of the encoder circuit FE and the synchronizing of the decoder circuit FD as required in an actual magnetic tape interface, may be approached in the following manner. The encoder may be started by outputting the word having value "one". This would produce a fixed preamble of zero cells, which would allow the period of the retriggerable one-shot 13, FIG. 9, to be adjusted slightly to match the actual tape speed during the preamble. This word would produce a Fibonacci Code which would terminate with two one-cells, which could be detected to start up the decoder circuit. A suitable magnetic tape cassette transport apparatus useable with the above-described decoder FD and encoder FE is, for example, the Type CM 600 Mini Cassette Transport of Braemer Computer Devices, Inc. of Burnsville, Minn.

Considering, now, illustrative practical circuit components useful to implement the encoder and decoder circuits, reference may be made to FIG. 11 which provides further details of the Fibonacci generator 3, of FIG. 5, common to both the encoder FE and decoder FD of FIGS. 7 and 9, respectively. In the specific implementation of FIG. 11, standard bipolar circuits are shown, with the high bit and low bit PROMS 20 being, for example, of the Signetics Type 82S23 PROM (32 by 8); and the corresponding synchronous counters 10 may be of the Texas Instruments Type SN74LS161. the "INVERTER" used in the CLOCK input to and in the output of the counter 10 (FIGS. 5 and 11) may be of the hex type SN74LS04 of Texas Instruments. The PROM contents for the high and low PROMS 20 of FIG. 11 are set forth in FIG. 12, being more detailed than those shown for address $A_o$–$A_4$ at the bottom of the more general diagram of FIG. 5. The addresses $A_o$–$A_4$ of each of the low and high bit PROMS 20 are tabulated in the left-most column of FIG. 12, and the PROM lines $F_o$–$F_7$ and $F_8$–$F_{15}$ are tabulated in the right-most and center columns, respectively, for a best mode embodiment.

A preferred format for the subtractor 24 of the Fibonacci Encoder FE of FIG. 7 is detailed in FIG. 13 with respective 16-bit inputs $A_o$–$A_{15}$ and $B_o$–$B_{15}$ applied to four 4-bit address illustrated as of the Texas Instruments Type SN74LS283, producting the 16 outputs $S_o$–$S_{15}$ for application to the multiplexer 5 (FIG. 7). A twos-complement subtraction is caused by inverting the B input lines, and adding one via the lowest carry-in input CO. Of course, if the Fibonacci generator is not shared with the one used in the decoder, the Fibonacci numbers in the generator PROM could be inverted, and the inverters could then be eliminated. Such a multiplexer 5 is more specifically detailed in FIG. 14, with its 16 A and B inputs ($A_o$–$A_{15}$ and $B_o$–$B_{15}$) applied to four quad 2-1 multiplexer chips of the Texas Instruments Type SN74LS157, for example, providing outputs 1/o–1/15 for application to the 16-bit accumulator register 9 of FIG. 7. That register 9 may assume the specific form of FIG. 15, comprising a pair of octal registers as of the Texas Instruments Type SN74LS273.

Figure 16:
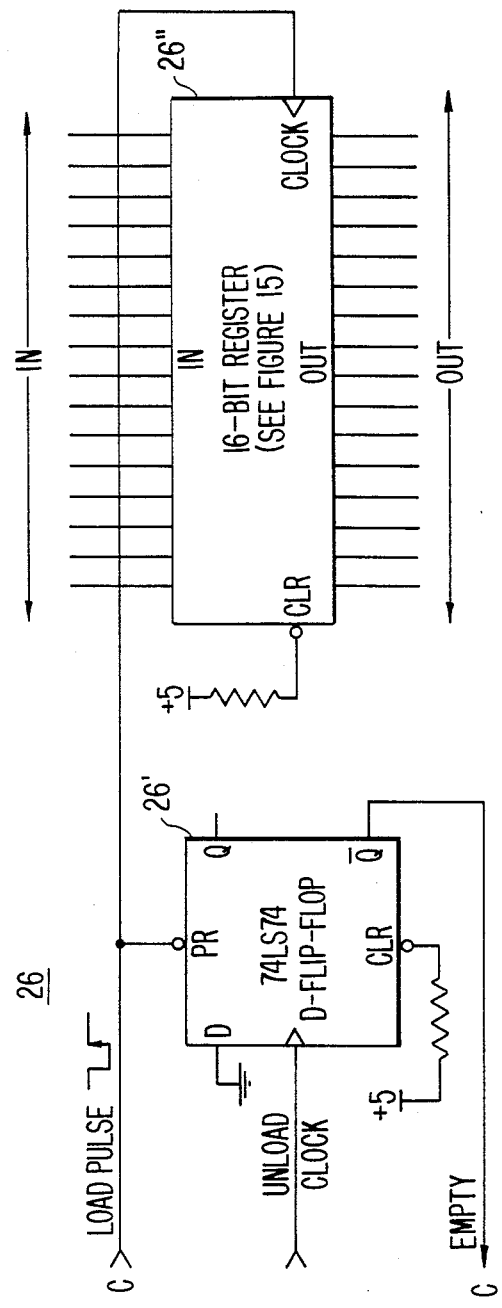

Continuing with the encoder of FIG. 7, the "next word" input register 26, may be of the configuration shown in FIG. 16 providing "handshaking" logic, later amplified. The register is shown in the format of a flip-flop 26' (as of the Texas Instruments Type Dual-D SN74LS74) and a 16-bit register 26" (as of the type shown in FIG. 15). The "LOAD PULSE" (FIGS. 16 and 7) sets the flip-flop 26' removing the "EMPTY" signal. The trailing edge clocks the register 26" with data from the computer C on the input lines. The "UNLOAD CLOCK" occurs when the word in the register has been used. It clears the flip-flop on its trailing edge, asserting the "EMPTY" signal, which informs the computer C that it can send another word. This handshaking flip-flop provides synchronization between the computer, which loads the input register, and the encoder circuit, which unloads it.

FIG. 17 details a preferred form of adder 23 for the decoder FD of FIG. 9 embodying four 4-bit adders, as of the Texas Instruments Type 74LS283, also used in the substractor 24 of FIGS. 7 and 13. The decoder output register 22 of FIG. 9 may assume the form of FIG. 18 (somewhat similar to that of FIG. 16), using a D flip-flop 22' and 16 bit register 22", as of the types before listed. The "LOAD CLOCK" input clocks data from the Fibonacci decoder "IN" to the register and sets the flip-flop, asserting the "DATA AVAILABLE" signal to the computer C. The computer reads the data onto its bus using the "UNLOAD PULSE", which also clears the flip-flop and removes the "DATA AVAILABLE" signal—again, a "handshaking" logic operation with the computer C.

Suitable chips for other components may be as follows: retriggerable one-shot 13 of the decoder of FIG. 9—Texas Instruments Types 74LS123; and in the encoder of FIG. 7, triple 3-input NAND gate 12—Type SN74LS10; quad 2-input AND gate 11—Type SN74LS08; dual J-K Flip Flops 7 and 14—SN74LS76; and quad 2-input NAND gate 8—SN74LS00.

Returning to the use of the invention on time cards T, as described in connection with FIGS. 1A–4, the encoder FE and decoder FC may equally well be used to interface with printing apparatus to record and/or store bar codes on cards or other media (FIGS. 1 and 4) instead of on magnetic media as above. When optically reading a bar code, as by the sensors 1 of FIGS. 1A and 1B, it is possible to image the code with a lens onto multiple sensors 1, which eliminates the issue of speed control which exists with magnetic media. Multiple magnetic reads may also solve the speed problem on magnetic media, but can be impractical due to the small head spacing that would be required (the head spacing would be smaller than the actual heads themselves).

As for printing, the code bars on the time card T, fixed codes can be printed in a conventional manner. Variable or sequenced codes can easily be printed by feeding the output of the encoder circuit FE above-described to an ink-jet press IP, FIG. 19. In this case, turning the ink stream on and off is the equivalent of driving a tape head in the magnetic case. A typical time-card printed by this process is shown in FIG. 20, in part Fibonacci-encoded, with the encoder FE driving a model 2700 Diconix Ink-Jet Printer.

Other modifications will occur to those skilled in this art, including application ovf the method of the invention to linear media and, more particularly, to code transmission systems where the advantages attained by the method are desired; and such are considered to fall within the spirit and scope of the invention as defined in the appended claims.

What is claimed is:

1. A machine-implemented method wherein numbers are digitally encoded in n fixed-length cells, n being an arbitrary integer, comprising the following machine-implemented encoding steps:
   (1) comparing a number to be encoded with a predetermined Fibonacci Number in a sequence of Fibonacci Numbers and generating a first code element consisting of a predetermined first integer number of cells if the number to be encoded is greater than or equal to said predetermined Fibonacci Number, but generating a first code element consisting of a predetermined second integer number of cells if the number to be encoded is less than said predetermined Fibonacci Number;
   (2) then, if a first code element of said first number of cells has been generated in step (1), subtracting said predetermined Fibonacci Number from the number to be encoded in step (1) and repeating the comparing and generating of step (1) using the difference obtained by the subtracting as the number to be encoded and using the Fibonacci Number preceding said predetermined Fibonacci Number in said sequence, but if a first code element of said second predetermined number of cells has been generated in step (1), performing no subtraction, and repeating the comparing and generating of step (1) using the original number to be encoded and the Fibonacci Number before said preceding Fibonacci Number, thereby to generate a second code element; and
   iterating steps (1) and (2) until n cells have been utilized in the encoding.

2. A method in accordance with claim 1, wherein said numbers are digitally encoded in a range from 0 to $Fib(n-1)$, where $Fib(n)$ is the nth Fibonacci Number in said sequence, and wherein said predetermined Fibonacci Number is $Fib(n-2)$, and $Fib(-1)=0$.

3. A method in accordance with claim 2, wherein each of the code elements of said first predetermined number of cells consists of one cell and each of the code elements of said second predetermined number of cells consists of two cells.

4. A method in accordance with claim 3, wherein encoded numbers are decoded by weighting each of the n cells with numbers $F(n-2)$ through $Fib(-1)$, respectively, and by adding together the weights of the cells of code elements consisting of one cell.

5. A method in accordance with claim 1, wherein n fixed-length cells representing each digitally encoded number are stored on a medium.

6. A method in accordance with claim 1, wherein signals are produced and transmitted that include n fixed-length cells corresponding to each digitally encoded number.

7. Apparatus wherein numbers are digitally encoded in a space of n fixed-length cells, n being an arbitrary integer, comprising:
   means for comparing a number to be encoded with a predetermined Fibonacci Number in a sequence of Fibonacci Number and generating a first code element consisting of a predetermined first integer number of cells if the number to be encoded is greater than or equal to said prededetermined Fibonacci Number, but generating a first code element consisting of a predetermined second integer number of cells if the number to be encoded is less than said predetermined Fibonacci number;
   means for subtracting said predetermined Fibonacci Number from the number to be encoded if a first code element of said first number of cells has been generated and for repeating said comparing and generating using the difference obtained by the subtracting as the number to be encoded and using the Fibonacci Number preceding said predetermined Fibonacci Number in said sequence, but if a first code element of said second number of cells has been generated, performing no subtraction, and repeating said comparing and generating using the original number to be encoded and the Fibonacci Number before said preceding Fibonacci Number, thereby to generate a second code element; and means for causing all of the aforesaid means to operate iteratively until n cells have been utilized in the encoding.

8. Apparatus in accordance with claim 7, wherein said numbers are digitally encoded in a range from 0 to Fib(n−1), where Fib(n) is the nth Fibonacci Number in said sequence, and wherein said predetermined Fibonacci Number is Fib(n−2), and Fib(−1)=0.

9. Apparatus in accordance with claim 8, wherein each of the code elements of said first predetermined number of cells consists of one cell and each of the code elements of said second predetermined number of cells consists of two cells.

10. Apparatus in accordance with claim 9, further comprising means for decoding the encoded numbers by weighting each of the n cells with numbers Fib(n−2) through Fib(−1), respectively, and by adding together the weights of the cells of code elements consisting of one cell.

11. Apparatus in accordance with claim 10, wherein the decoding means includes an accumulator register, a Fibonacci word bit generator connected to an adder, with an output of the adder connected to the accumulator register and an output of the accumulator register connected back to the adder and to an output register, the output register being interfaced with computer control means.

12. Apparatus in accordance with claim 11, wherein each of the code elements of said first predetermined number of cells consists of one cell and each of the code elements of said second predetermined number of cells consists of two cells, and wherein the accumulator register compensates for the Fibonacci weights and skips a number on the occurrence of a code element consisting of two cells.

13. Apparatus in accordance with claim 7, further comprising means for recording on a medium signals that include n fixed-length cells for each digitally encoded number.

14. Apparatus in accordance with claim 7, wherein the means recited comprises the combination of a Fibonacci word bit generator connected to apply an output to a subtractor, a multiplexer connected to receive an output of the subtractor and, in turn, to feed an accumulator register, an output of which is applied back to the subtractor, and a computer-controlled "next word" register connected to the multiplexer.

* * * * *